United States Patent
Spitz et al.

[11] 4,052,706
[45] Oct. 4, 1977

[54] SYSTEM FOR READING AN OPTICAL RECORDING OF BINARY NUMERICAL DATA

[75] Inventors: Erich Spitz; Luigi d'Auria; Jean-Pierre Huignard, all of Paris, France

[73] Assignee: Thomson-CSF, Paris, France

[21] Appl. No.: 635,773

[22] Filed: Nov. 26, 1975

[30] Foreign Application Priority Data

Nov. 26, 1974   France ................... 74.38734

[51] Int. Cl.² .................. G11C 13/04; G11C 8/00
[52] U.S. Cl. .................. 340/173 LM; 340/173 LT; 350/3.5
[58] Field of Search ............. 340/173 LT, 173 LM; 350/3.5

[56] References Cited

U.S. PATENT DOCUMENTS

| | | | |
|---|---|---|---|
| 3,403,261 | 9/1968 | Bowers et al. | 340/173 LM |
| 3,407,405 | 10/1968 | Hoadley | 340/173 LM |
| 3,573,433 | 4/1971 | Harris | 340/173 LM |
| 3,765,749 | 10/1973 | LaMacchia | 340/173 LM |
| 3,912,391 | 10/1975 | Fleisher et al. | 340/173 LT |

OTHER PUBLICATIONS

Waterworth, A., $1.5 \times 10^8$ Bit Random Access Read-Only Holographic Memory, Digest of Technical Papers of Topical Meeting on Optical Storage of Digital Data, Aspen, Colo., 19-21, Mar. 1973, pp. ToA2-1-4.

*Primary Examiner*—Stuart N. Hecker
*Attorney, Agent, or Firm*—Cushman, Darby & Cushman

[57] ABSTRACT

The invention has for its object a reading arrangement which uses a source functioning by pulses and delay-action dividing optical means which successively ensure the illumination of M storage areas of the recording, each area comprising P bits 0 and 1. Thus, a single reading pulse makes possible the reading, with a mosaic of P photodetectors, of a block which comprises M words of P bits. The invention is particularly applicable to non-destructive optical reading stores, for instance holographic stores.

13 Claims, 8 Drawing Figures

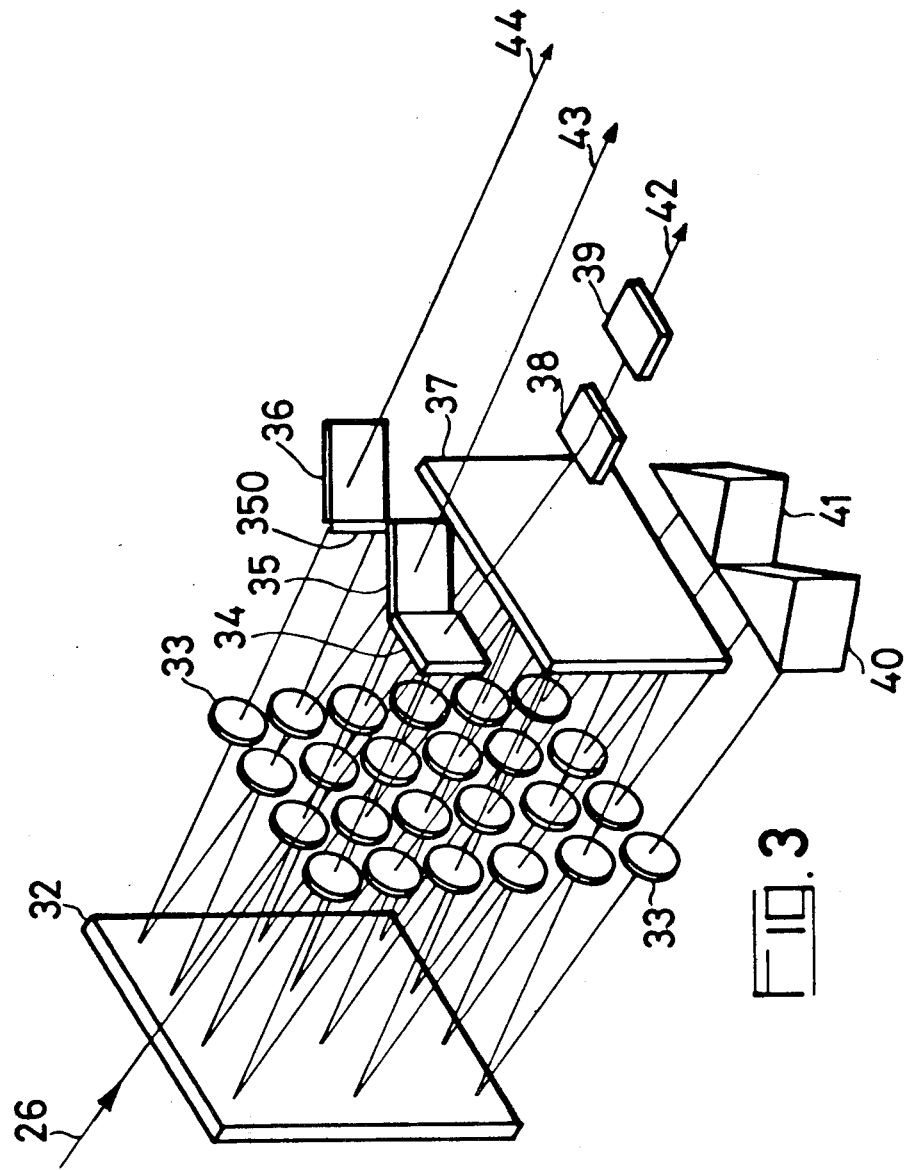

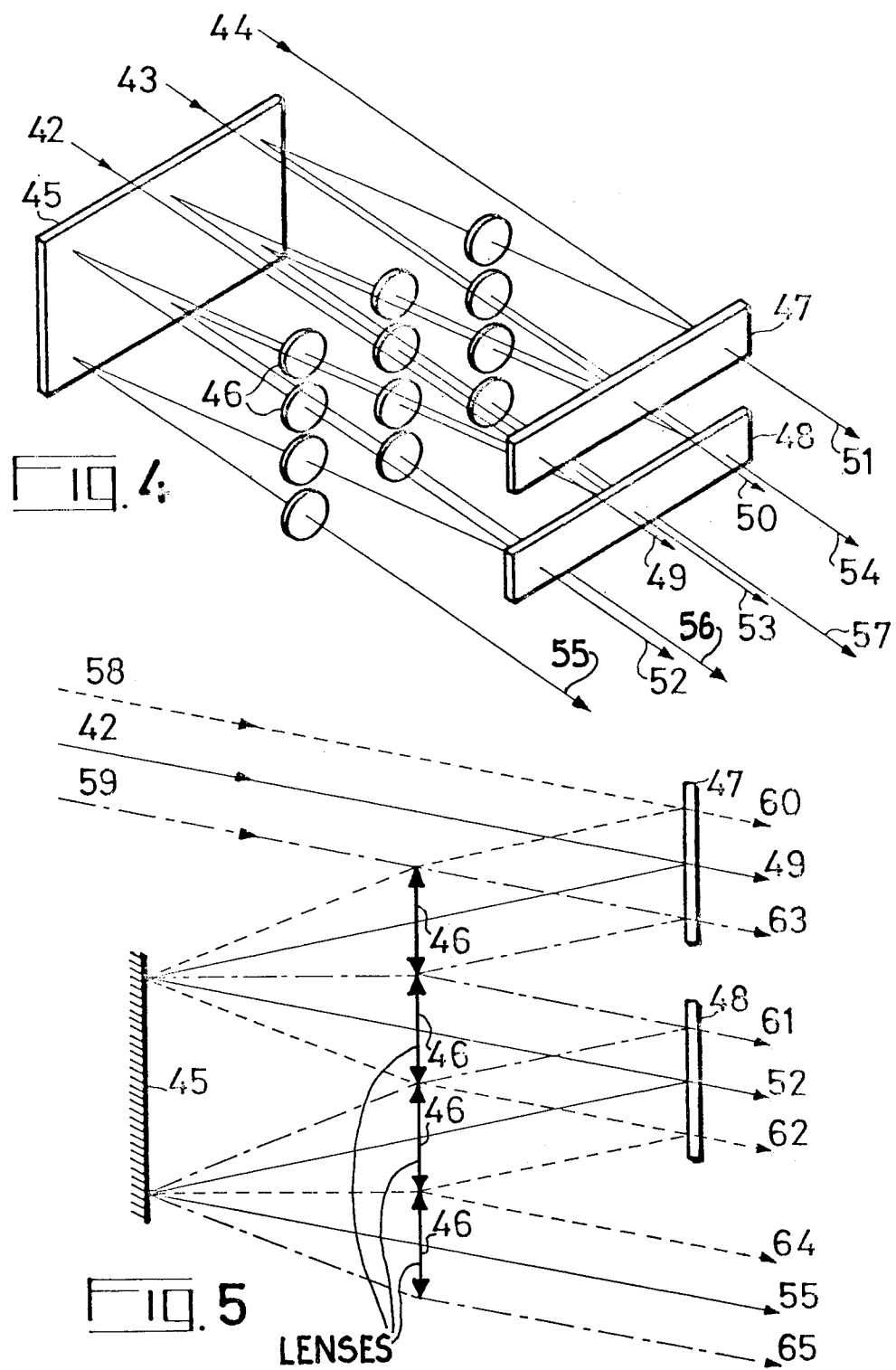

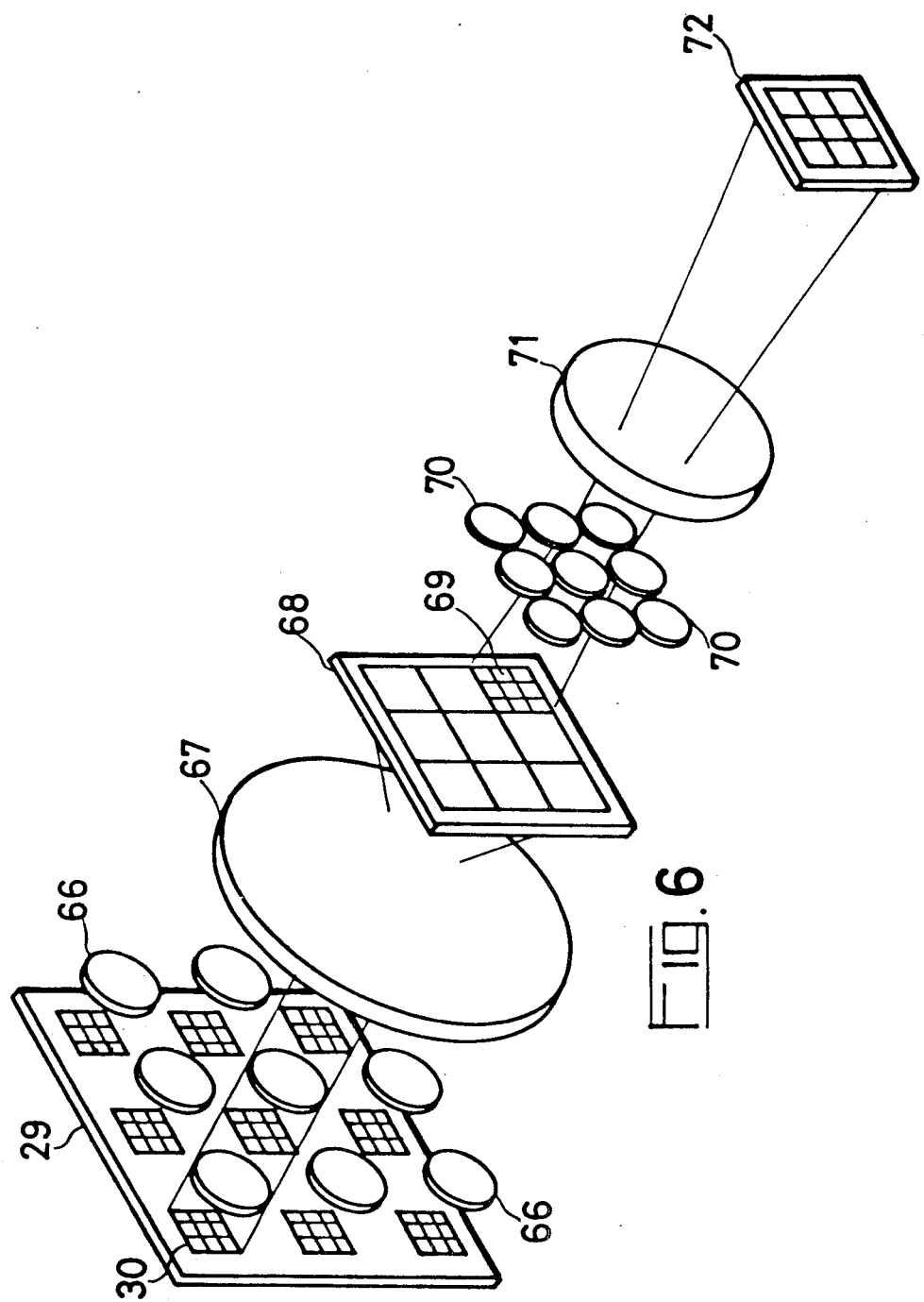

SYSTEM FOR READING AN OPTICAL RECORDING OF BINARY NUMERICAL DATA

The present invention relates to optical memories designed for storing binary numerical data in blocks of bits 0 and 1 which compose pages of information.

The optical reading of an optical recording composed of several pages assumes the addressing of the latter by means of a reading beam. The reading of a page necessitates that it is illuminated in such a manner as to project the image of its contents on to an assembly of photoelectric reading elements. In this way, the bits 0 and 1 are restored in the form of binary electric signals. In certain cases, the pages of an optical recording are formed by holograms constructed in such a manner that, under the action of a coherent reading beam, they assure the projection of images conforming exactly to the receiving faces of a group of photoelectric reading elements.

In other cases, the memory pages are formed by the inscription in clear of several blocks of binary numerical data and stigmatic optical means are used so that the image of the said pages is projected facing the photoelectric elements assuring the reading of their contents.

Whether the method of optical recording is holographic or not, it is established that the reading of a very large number of binary numerical data involves an important assembly of photoelectric reading elements, even if a high number of pages is adopted.

In the reading systems of known type, the reading of a block of data consists in uniformely illuminating a memory page and in analysing the image which it projects by means of a detection matrix comprising as many elements as there are bits in the block of data. In the applications where the data blocks comprise more than ten thousand bits, the detection matrix has a complex structure so that is becomes difficult to make it up, using the technique of integration on a single substrate.

In effect, the higher the number of bits to be read simultaneously, the greater has to be the size of the reading photodetector device. Thus, in the case of an optical memory having a capacity of $10^{10}$ bits arranged in $10^5$ blocks of $10^5$ bits, it is necessary to provide for each reading element of the matrix an elementary area of 0.5 square millimeter. Such a matrix composed of $10^5$ photodetectors, assumes at the stage of manufacture the use of a substrate having a dimension of at least 5 square decimeters, and this is prohibitive.

One of the solutions for overcoming this drawback consists in subdividing the detection matrix into smaller mosaics, but the complexity of the interconnections to be provided is shown by a decrease in the filling rate expressing the ratio between the effective surface of the detectors and the total surface of the detector device. With this method of construction, there is also found a limitation in the exploration frequency of the photodetector elements and this has the consequence of reducing the reading delivery of the binary numerical data.

In order to avoid these drawbacks, while offering the possibility of achieving reading delivery higher than 10 gigabits per second, the invention proposes the subdivision of each block of binary numerical data stored in a page into M words of P bits. Because of this subdivision, it becomes possible to read the M words of a single block by means of a single assembly of P photoelectric elements. The words of a single block are read during a single operation and, for this purpose, it has been proposed to subdivide the optical recording of each page of M . P bits into M non-contiguous storage areas. The reading beam is itself divided into M parts and applied successively to the M areas of each recorded page. This result is obtained by means of delay-action dividing optical means inserted between the reading radiation source and the optical recording of the data. As a sequential reading method is involved, the reading source functions by pulses and the electric signals representative of the bits 0 and 1 of a block have to be stored temporarily in a buffer store connected to the output terminals of the photoelectric elements.

According to the invention, there is provided a system for reading optical recording of binary numerical data, said recording being composed of at least one group of M (M being greater than 1) storage areas, each of said storage areas being adapted for projecting, into a detection plane, radiation corresponding to the image of P bits 0 and 1 (P being greater than 1), said system comprising:

a spatially coherent radiation source functioning by pulses for delivering an incident reading beam;

delay action dividing optical means ensuring the splitting up of said incident reading beam into an assembly of M collateral beams which are respectively directed towards said M storage areas, each pulse emitted by said radiation source being subdivided by said dividing optical means in order to successively illuminate said M storage areas;

an assembly of P photoelectric detector elements located in said detection plane adapted for simultaneously detecting said P bits in said image projected by each of said storage areas successively illuminated by said M collateral beams, and for furnishing P simultaneous binary electrical signals;

and electrical memory means coupled to said detector elements adapted for temporarily storing said binary electrical signals.

For a better understanding of the present invention and to show how the same may be carried into effect, reference will be made to the following description and the attached drawings among which;

FIGS. 3 and 4 are isometric views showing the internal arrangement of the delay-action optical means shown diagrammatically in FIG. 2;

FIG. 5 is an explanatory figure in respect of FIG. 4;

FIG. 6 is an isometric view of the optical projection means which can be used in the lay-out shown in FIG. 2;

Figure 1:
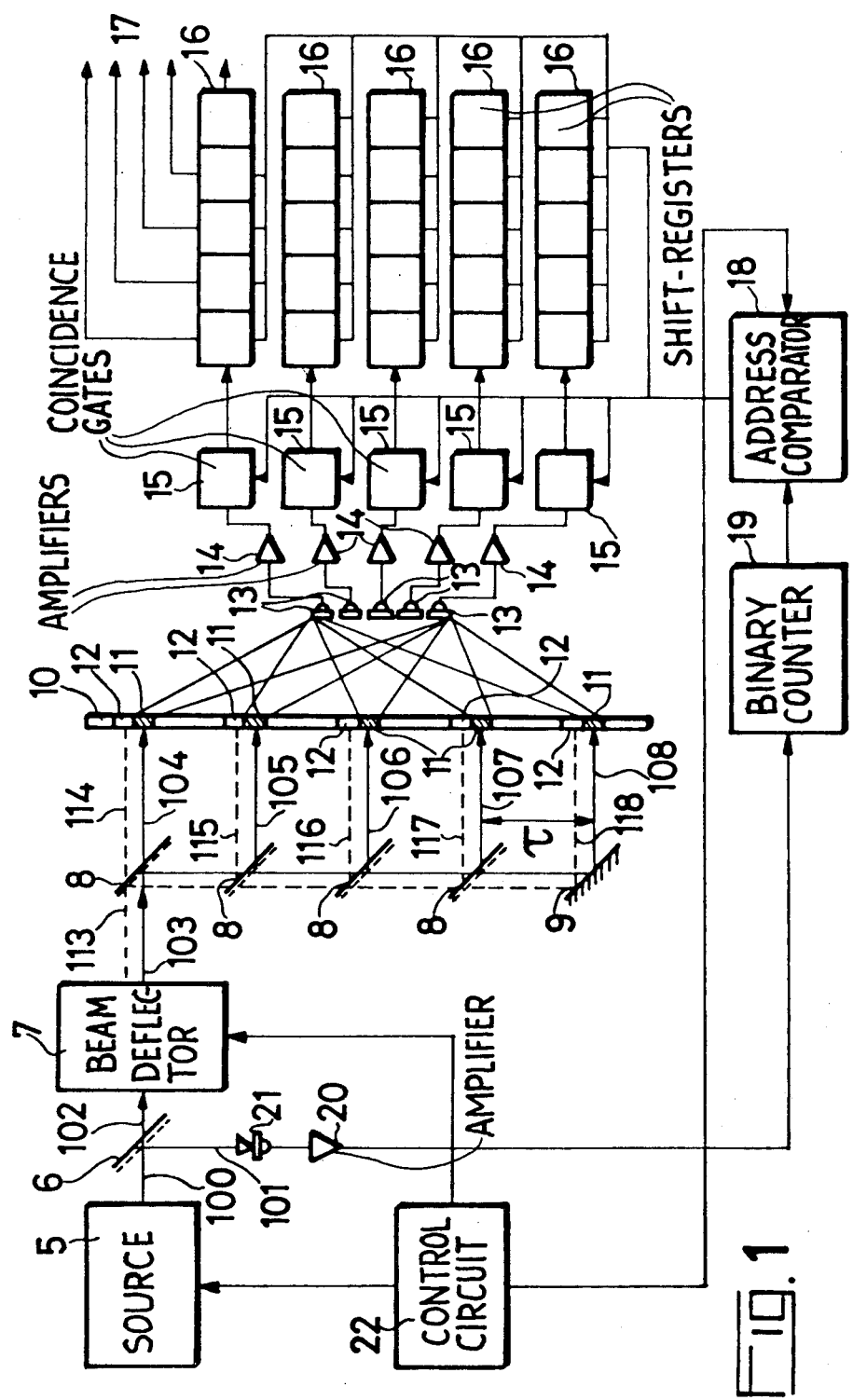
FIG. 1 represents a reading system adapted for the purpose of reading holographically stored binary numerical data.

A system designed for reading an optical recording 10 achieved by the procedure of holographic recording can be seen in FIG. 1. Without going into the details of this procedure, which is well known at the present time, it can be said that the recording 10 is split up into elementary storage areas, each containing a hologram formed by a bidimensional or tridimensional fringe grating. When a coherent reading radiation falls with appropriate incidence on any one of these fringe gratings, there is formed by diffraction a beam capable of projecting on to a detection device an image having for its confiration that of a grid of which the P divisions represent a word of P bits.

In FIG. 1, the fringe gratings are formed in the storage areas 11 and 12 of the optical recording support 10. When the hologram formed in any one storage area receives a spatially coherent reading radiation, it projects the image of P bits O and 1 on to the receiving faces of the P photoelectric transducers 13, so that these bits are clearly read.

The coherent radiation necessary for the reading of the optical recording 10 is provided by a reading source 5 operating by pulses. The source 5 delivers a reading beam 100, the section of which corresponds to the dimensions of the storage areas. The beam 100 emitted from the source 5 is received by a first semitransparent plate 6. The plate 6 reflects a fraction 101 of the incident radiation in the direction of a photoelectric transducer 21. The major part 102 of the radiated energy is transmitted through the plate 6 towards a beam deflector 7 with N positions. The positioned reading beam 103 or 113 which emerges from the beam deflector 7 is received by a delay-action dividing optical device which, in FIG. 1, comprises four semitransparent plates 8 and an end mirror 9. The first function of the delay-action dividing optical device 8–9 is to split up the positioned beam 103 or 113 which enters it into five collateral beams 102 to 108 or 114 to 118. The collateral beams 104 to 108 or 114 to 118 which emerge from the dividing optical device 8–9 thus illuminate the storage area assemblies 11 or 12. The storage areas 11, which are illuminated when the reading beam 102 has not been subjected to any translation on the part of the beam deflector 7; this phase of operation is represented in a solid line in FIG. 1.

The storage areas 12 which are not hatched in FIG. 1 are illuminated in their turn, when the reading beam 102 has experienced a translation; the new trajectories 113 to 118 are represented by a broken line in FIG. 1.

In addition to the splitting up of the reading beam 103 or 113, the delay-action dividing optical device 8–9 introduces staggered delays between the fractions of radiated energy which are respectively reflected by the plates 8 and the mirror 9. It can be seen from FIG. 1 that the reading radiation fractions follow paths of unequal lengths. When a reading pulse has reached the storage area 11 situated at the highest position in FIG. 1, a time $\tau$ elapses before the closest storage area 11 situated on a lower level in its turn receives a fraction of this reading pulse. The process of division and delayed reception is continued by degrees. The distribution of the instants when the reading radiation fractions are received by the areas 11 obviously depends on the spacing of the plates 8 and the mirror 9 and also on the propagation velocity of the reading radiation. In practice, a constant delay $\tau$ is chosen between two radiation fractions reaching storage areas which follow one another in a single group and in addition the delay $\tau$ is regulated so that it is at least equal to the duration of the reading pulses emitted by the source 5. When these conditions are satisfied, two storage areas 11 of a same group cannot be simultaneously illuminated.

As has already been stated, the reading of the P bits stored in each of the areas 11 or 12 is effected by a matrix of P photoelectric elements 13. The binary electrical signals resulting from this reading are transmitted through P amplifiers 14 towards P coincidence gates 15. The output terminals of the P coincidence gates 15 are connected to shift registers 16 which serve the purpose of a buffer store. The control of the various members of the reading system in FIG. 1 is assured by a control circuit 22, which ensures the triggering of the emission from the source 5 and the control of the beam deflector 7. This circuit also supplies to a binary address comparator 18 the indication relating to the rank or row occupied by a determined word in the data block which it is proposed to read. The address comparator 18 also receives a numerical indication supplied by a binary counter 19, the function of which has been initiated by a pulse supplied by the transducer 21 and amplified by the amplifier 20. The output of the address comparator 18 controls the coincidence circuits 15 and the shift-registers 16.

The functioning of the system shown in FIG. 1 can be easily understood by noting that the binary numerical data of a page to be read are distributed in blocks which are subdivided into M words each of P bits. It is assumed in FIG. 1 that the words number is five in each block and that each word is formed of five bits. In general, N blocks form the optical recording, but in order to simplify the drawing, the content of the optical recording 10 has been limited to two data blocks. It is obvious that in actual fact the numbers M, N and P are much larger.

Taking into account the simplifying hypothesis which has just been mentioned, it is seen that the reading beam only occupies one of the two positions 103 and 113 at the outlet of the beam deflector 7. The position 103 is that which permits the reading of a first block, the words of which are contained respectively in the five non-contiguous storage areas 11, while the position 113 is intended to ensure the reading of a second block, the words of which are respectively stored in the non-contiguous storage areas 12.

When the reading phase of the first block of binary numerical data begins, shift registers 16 are free and the coincidence gates 15 cannot transmit any signal. The control circuit 22 supplies to the address comparator the rank of the word, or words, to be read in the data block and it is simultaneously operative on the beam deflector 7 so as to bring the reading beam into the position 103, provided for the reading of the storage areas 11. With the binary counter 19 reset at zero, the control circuit 22 triggers the operation of the reading source 5, which emits a reading pulse having a duration smaller than or equal to the delay $\tau$. A first fraction of the energy contained in the reading pulse is transmitted towards the photoelectric transducer 21, setting the counter 19 in operation, which functions with a recurrence period equal to the delay $\tau$. A second fraction of the energy contained in the reading pulse reaches the highest storage area 11 when the counter 19 shows a unit. While it is illuminated, this storage area 11 diffracts a radiation which is projected on to the photoelectric element assembly 13. This assembly thus receives the image of P bits of the first word of the selected block and supplies P binary electrical signals, which are amplified by the amplifiers 14. If the projected word is the word which it is desired to read, the addresses supplied by the counter 19 and the control circuit 22 are in agreement. The address comparator 18 then acts on the coincidence gates 15 and the shift registers 16 in order to store in the memory the P binary electrical signals. With the contrary hypothesis, no memorising of the binary electrical signals takes place.

After the reading of the first word, the highest storage area 11 ceases to be illuminated and it is the turn of the closest storage area 11 situated therebeneath to receive a third fraction of the reading radiation. The counter 19 has advanced one step and the second word of the block is projected on to the same photoelectric element assembly 13. The operations are continued in the same manner, until all the storage areas 11 of the first block of binary numerical data have been illuminated.

For passing on to the reading of the second block of binary numerical data, the reading beam assumes the position 113, so as successively to illuminate the storage areas 12 which make up the optical recording of this second block.

The coincidence gates 15 are only to be provided to the extent where it is desired to select the words of which the bits are to be stored in the shift registers 16. If all the signals delivered by the photoelectric elements 13 are stored in reserve, it is possible to omit the coincidence gates 15 and the address comparator 18. In this case, the control of the registers 16 is effected directly from the counter 19, which supplies pulse with a recurrence period equal to the delay $\tau$. In all cases, the bits 0 and 1 of the block which is read are available at the outputs 17 of each of the shift registers 16.

Simply by way of example, it is possible in practice to achieve a reading system having a storage capacity of a million bits, by adopting the following distribution: N = 100 blocks, M = 100 words and P = 100 bits. Under these conditions, the optical recording 10 comprises 100 groups of 100 elementary areas, each formed by the hologram of a word of 100 bits. The matrix of photodetectors 13 comprises about a hundred elements. If it is assumed that the photodetectors 13 are formed by P.I.N. photodiodes and that the reading radiation is supplied by a pulsating laser, it is possible to reach a time for acquistion of the read signal which does not exceed 5 nanoseconds. The reading of a word of 100 bits thus necessitates an illumination time of 500 nanoseconds. This time corresponds to the reading pulse time and also to the minimum value of the delay $\tau$ to be provided for as follows. With these figures, a reading rate of 20 gigabits per second is obtained.

Figure 2:
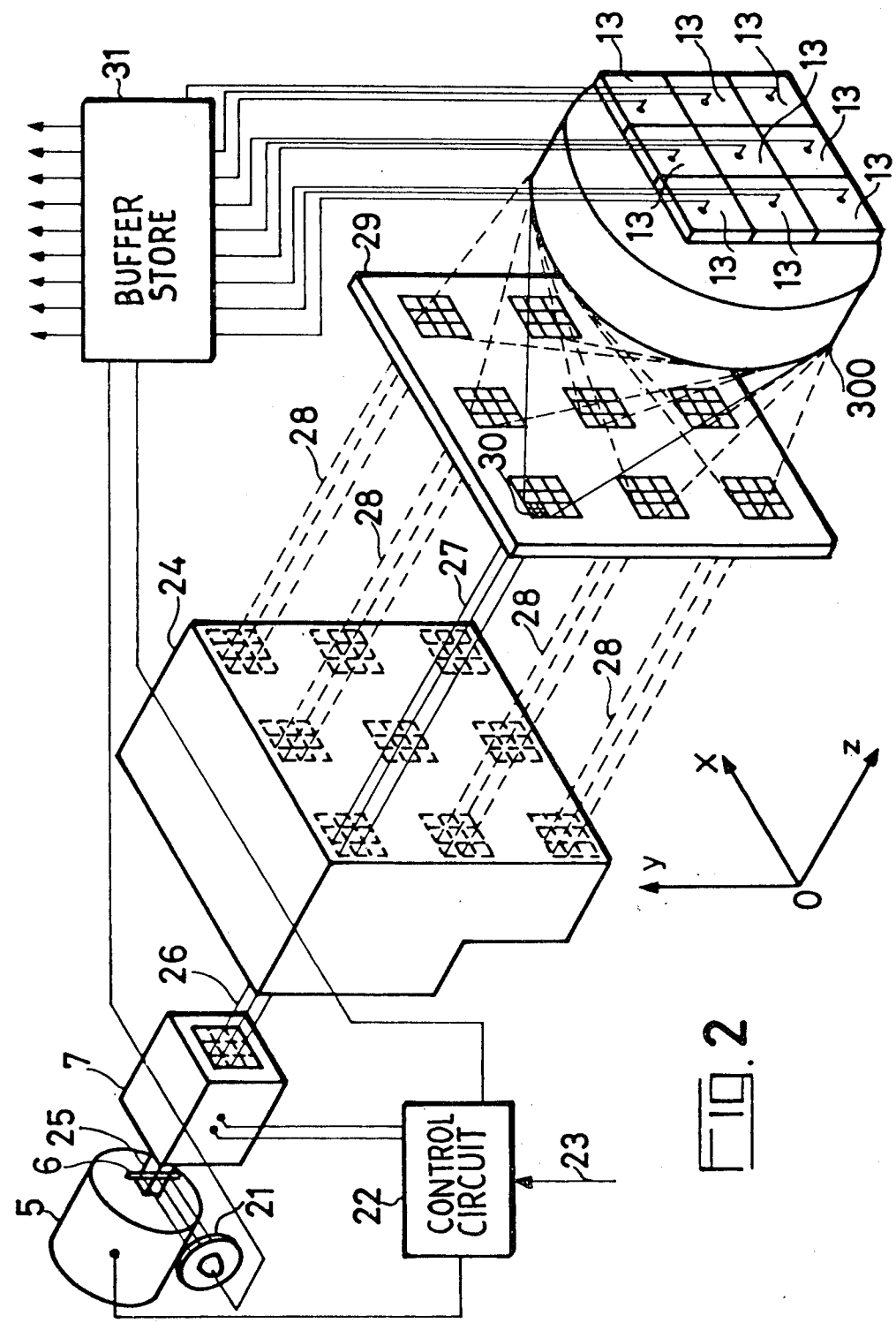
FIG. 2 represents a modified form of the reading system adapted for the reading of binary numerical data stored in clear.

A modified form of the reading system according to the invention can be seen in FIG. 2. In this modified form, the optical recording 29 comprises storage areas recorded in clear language. Thus the storage area 30 is provided in the form of a grid with nine subdivisions, of which the transparency to the reading radiation is strong or weak, depending on whether a bit 1 or a bit 0 is involved. When the storage area 30 is illuminated, there emerges from the said area a beam of spatially modulated intensity, which is received by a projection optical device 300, the description of which will be given later. The function of the optical device 300 is to form the image of any one of the storage areas inscribed on the recording 29 on a matrix of photoelectric detectors 13 which occupies a fixed position. Each projected image is the transcription of a word of nine bits. The system of FIG. 2 comprises nine blocks of binary numerical data and each block is subdivided into nine words of nine bits. As previously, it has to be noted that the storage areas which represent a single block of binary numerical data are not contiguous. On the contrary, all the storage areas which represent the words of equal rank in all the blocks can be scanned, although they belong to separate pages.

Certain elements of FIG. 1 also appear in FIG. 2, and particularly a reading source 5 functioning by pulses and a control circuit 22, the input 23 of which receives the addressing indications of the blocks and words. The source 5 emits a spatially coherent radiation in the form of a reading beam 25 with weak divergence, which radiation is designed locally to illuminate the information support 29. A fraction of this radiation is diverted by means of a semitransparent plate 6, which sends it towards a photodetector element 21. The major part of the reading radiation is transmitted by the plate 6 towards a beam deflector 7, from which emerges a reading beam 26 which is able to occupy one of the nine positions necessary for the selective reading of nine data blocks. The reading beam 26 is received by a delay-action dividing optical device 24, which splits up the reading radiation into nine parts showing staggered transmission delays. At the outlet from the device 24, nine subdivided beams 27 and 28 are obtained, which respectively reach the recorded areas 30 containing the words of the same data block. A control circuit 22 initiates the functioning of the device and effects the addressing of the data blocks. The binary electric signals available at the outputs of the photoelectric elements 13 are introduced into a buffer store 31, which functions under the control of synchronising pulses supplied by the transducer 21. The control circuit 22 supplies to the buffer memory 31 the address of one of the words which it is desired to read.

The functioning of the reading system in FIG. 2 is substantially the same as that which has been previously described in relation to FIG. 1.

One of the particular features as regards this functioning consists in the two-dimensional arrangement of the positions successively occupied by the beam 26 and in the likewise two-dimensional subdivision operated by the delay-action dividing optical device 24. For an established position of the beam 26, nine elementary beams 27 and 28 are formed, which transport, at staggered instants, fractions of radiated energy originating from the reading pulse emitted by the source 5. The information support 29 comprises, in total, 81 storage areas 30 disposed in a plane parallel to the reference axes OX and OY.

Another particular feature as regards the functioning of the system shown in FIG. 2 concerns the recording of the data in clear. Each area 30 comprises a group of nine bits arranged on three lines and three columns, this bringing the storage capactiy of the support 29 to 729 bits. An enlarged image of any one of the areas 30 is projected on to the mosaic of photodetectors 13 by means of an optical device 300, of which one possible structure has been shown in FIG. 6.

The formation of the delay-action dividing optical device 24 necessitates an assembly of semitransparent plates adapted to subdivide the incident reading beam into nine elementary beams.

Simply as an example, this optical subdivision can be achieved in two successive steps. In a first step, illustrated in FIG. 3, the incident beam 26 is subdivided into three intermediate beams 42, 43 and 44, which are parallel to the axis OZ of FIG. 2 and contained in a plane parallel to the plane XOZ.

In FIG. 3, two mirrors 32 and 37 having the opposite reflecting faces parallel to one another are arranged. An assembly of convergent lenses 33 is interposed between the mirrors 32 and 37 so that the focus of each lens 33 is situated in the reflecting face of the mirror 32. The mirror 37 is associated in the upper part of the drawing with three semitransparent plates 34, 35, 36 and a mirror 350. In the lower part of the drawing, two reflecting prisms 40 and 41 are associated with the mirror 37. Mirrors 38 and 39 are placed along the path of the beam 42, so that the said beam emerges parallel to the beams 43 and 44.

The manner in which the separator device of FIG. 3 operates is as follows: the incident beam 26 falls with a slightly oblique incidence on the semitransparent plate 34. The fraction of radiated energy transmitted by the plate 34 provides the first intermediate beam 42. The fraction of radiated energy reflected by the plate 34 is received by a first lens 33 situated at the intersection of the upper line and the column on the left. This energy fraction is concentrated by the first lens 33 on the reflecting face of the mirror 32, which sends it back towards the second lens 33 of the same column, this latter in its turn projecting it on to the mirror 37, in the form of a parallel beam. The mirror 37 reflects this beam back to a third lens 33 of the same column and the propagation is continued between the mirrors 32 and 37 along a zig-zag path, which finishes on the reflecting prism 40. The radiated energy which emerges from the prism 40 follows a similar zig-zag path, passing through the lenses 33 of the second column and, at the end of this path, it encounters the semitransparent plate 35. The fraction of radiated energy transmitted by the plate 35 forms the second intermediate beam 43. The fraction of radiated energy reflected by the plate 35 is sent by the mirror 350 towards the first lens 33 of the third column. A new zig-zag propagation is established between the mirrors 32 and 37 until the radiation reaches the semitransparent plate 36 from which emerges the third intermediate beam 44. If there is a restriction to three intermediate beams, the plate 36 can obviously be omitted.

It can be easily seen from FIG. 3 that a reading pulse contained in the incident beam 26 is subject during its propagation to a spatial subdivision accompanied by a shift in time. By comparing the transmission delays between the paths 42, 43 and 44, it is possible to impose a delay equal to $n$ times an incremental duration $\tau$ between two consecutive paths, the value $n\tau$ of the delay obviously depends on the propagation velocity of the reading radiation and the distance covered between two reflections on consecutive semitransparent plates.

Simply by way of example, with an incremental duration $\tau$ equaol to 5 nanoseconds and assuming that it is desired to subdivide the beam 26 into 10. 10 elementary beams, it is necessary to choose $n$ equal to 10, this representing a delay of 50 nanoseconds between two consecutive intermediate beams. Knowing that the propagation velocity of the reading radiation is equal to $3.10^8$ m/sec, the distance covered between two reflections on consecutive separating plates is equal to: $50 \ 10^{-9} \cdot 3.10^8$ = 15 meters. If 20 lenses 33 are provided along this path, it is seen that the distance separating the mirrors 32 and 37 has to be of the order of 15/20 = 0.75 meter.

In order to obtain ten intermediate beams, it will be necessary to have $9 \cdot 20$ lenses arranged in eighteen columns of ten lenses 33. In this case, each lens will have a focal length of 0.375 meter and a pupil diameter close to one centimeter. The matrix of lenses 33 has a transverse dimension of $10 \cdot 18$ cm and the spacing between consecutive intermediate beams will be 2 cm. Because of the great length of the optical paths, it is necessary to provide lenses for avoiding a harmful increase in the section of the auxiliary beams. Because of the very large number of reflecting surfaces and the presence of numerous lenses, it is necessary to make use of mirrors which have a very high reflecting power and also lenses which have been subjected to a very efficient anti-reflection treatment.

FIG. 4 shows an optical device which effects the second subdivision step. This device, which follows the device of FIG. 3, comprises a mirror 45, a matrix of convergent lenses 46 and an assembly of semitransparent plates 47, 48, having a common semi-reflecting face parallel to the reflecting face of the mirror 45. The three intermediate beams 42, 43 and 44 are received with a slightly oblique incidence by the plate 47. The transmitted fractions of the radiated energy form the elementary beams 49, 50 and 51. The reflected fractions are picked up along the upper line of the lenses 46 and focused by these latter on the mirror 45. The energy fractions reflected by the mirror 45 are transmitted via the second line of lenses 46 towards the plate 48, which transmits the elementary beams 52, 53 and 54. The elementary beams 55, 56 and 57 are obtained after a new forward and return movement via the third and fourth lines of lenses 46. In this case, where it is desired to obtain about a hundred elementary beams, it is necessary to provide a matrix comprising 10 columns of eighteen lenses 46. It is seen that, with the same spacing of the reflecting surfaces and the same lenses, an incremental delay $\tau$ equal to 5 nanoseconds is obtained between two consecutive elementary beams on a similar vertical plane. By arithmetically combining the delays introduced by the devices of FIGS. 3 and 4, it is established that the one hundred elementary beams which are formed have delays which are staggered between zero and 99 times the incremental value $\tau$.

The delay-action dividing optical device which is shown in FIGS. 3 and 4 is compatible with the selection by translation of the incident reading beam. For illustrating this fact, it is possible to see in FIG. 5 a plan view of the optical device shown in FIG. 4. The path of the beam 42 and that of the beams 49, 52 and 55 for a mean position of these beams is shown by a solid line. By shifting upwardly the beam 42 there is obtained the marginal track as a broken line, which shows that the intermediate beam 42 occupies the position 58 and that the elementary beams 49, 52 and 55 occupy the positions 60, 62 and 64. In the case of a shifting movement in the opposite direction, there is obtained the marginal track as a chain-dotted line, to which correspond the position 59 of the incident beam and the positions 63, 61 and 65 of the emergent beams. It has to be noted that a translation does not have the same direction when passing from one elementary beam to the following, but this particular feature is of no consequence as regards the reading, provided the data storage areas are suitably arranged.

Figure 7:
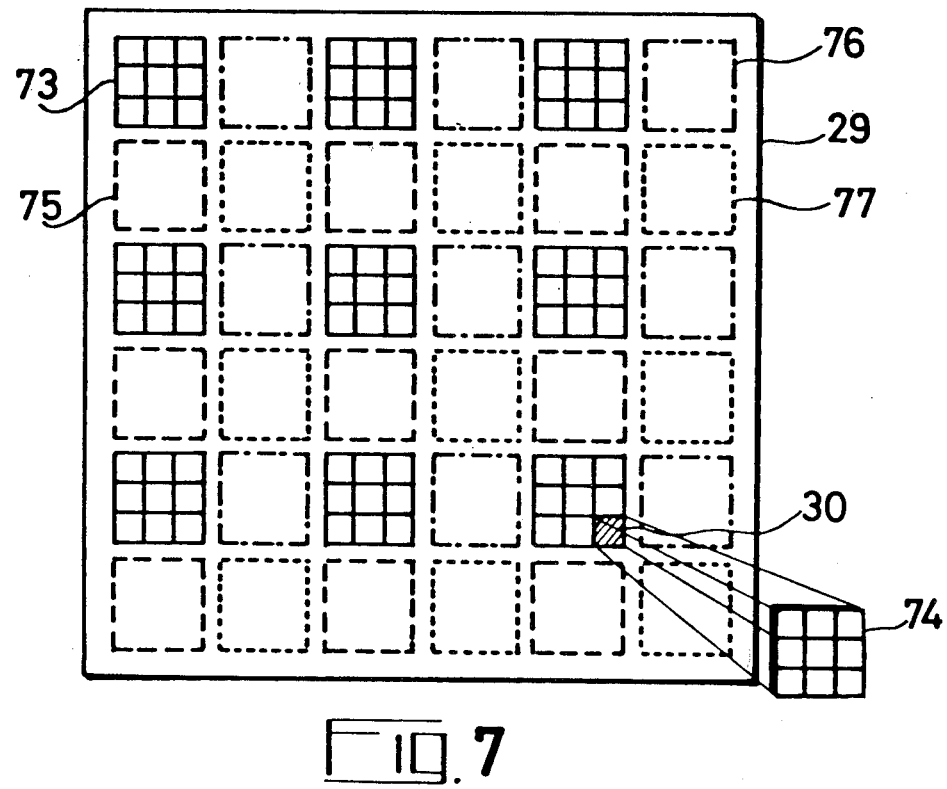
FIG. 7 is a front view representing an optical recording of several blocks of binary numerical data.

FIG. 5 shows that the elementary beams which emerge from the dividing optical device equipped with lenses are not able to reach any point of the support where the data are stored. In effect, the emergent beams are situated inside bands which are defined by the traces (60, 63), (61, 62) and (64, 65). In FIG. 7, which is a plan view of the data storage support 29, the nine regions 73 which are accessible to the elementary reading beams are shown in solid lines. Each region is split up into nine storage areas 30, each of which is capable of projecting the image 74 of nine information bits. Quarter of the surface of the support 29 is therefore covered by the regions 73. In order to increase the quantity of stored data, three other region assemblies can be disposed at the surface of the support 29. One of these assemblies comprises the regions 76 which are shown in chain-dotted lines, a second comprises the regions 75 shown in broken lines and the third of these assemblies comprises the regions 77 shown in dotted lines. This intercalated arrangement permits of quadrupling the storage capacity of the support 29. In order to select any one of the four region assemblies, it is possible to subject the support to translatory movements or rotational movements by a quarter of a revolution, which permit the said regions to be substituted one for the other. This selection is combined with that which is produced by the translatory device 26 in order to select in each region the area 30 to be illuminated.

When an area or region 30 is illuminated, it is necessary for it to project the image of the stored data in plain language in this area on to a matrix of photodetectors 13. This projection is obtained by means of an optical projection device 300, and FIG. 6 illustrates one possible constructional form of this device and the operation thereof.

It is possible to see in FIG. 6 a data support 29 comprising 81 storage areas 30 arranged in nine groups of nine areas in accordance with a matrix-like arrangement having three lines and three columns. Each area 30 is itself formed by the recording in plain language of nine bits, which are themselves also disposed on three lines and three columns. Opposite the support 29, there is shown a matrix 72 of nine photodetector elements which are adapted to receive the image of any one of the areas 30 of the support 29. In order to ensure the optical projection of this image, a diffuser screen 68 and two lens systems are provided. The first of these lens systems is situated between the support 29 and the screen 68. It comprises an assembly of nine convergent lenses 66 which are respectively positioned facing groups of areas of which the support 29 is composed. The lenses 66 have a focal length equal to the distance which separates them from the storage face of the support 29. One convergent lens 67 is positioned between the lenses 66 and the screen 68, so as to collect the radiated energy which emerges from these latter. The focal length of the lens 67 is equal to the distance which separates it from the diffusing face of the screen 68. The second lens system is situated between the screen 68 and the photodetecting matrix 72. It is also composed of an assembly of nine convergent lenses 70 and one convergent lens 71. The lenses 70 have a focal length equal to the distance which separate them from the diffusing face of the screen 68 and the lens 71 has a focal length equal to the distance wich separates it from the detecting face of the matrix 72.

When any one of the areas 30 is illuminated, the image of the group which contains it is projected by the first stigmatic system 66, 67 on to the diffusing face of the screen 68. As a single area of the group is illuminated, only the image 69 of this area will be effectively visible on the screen 68. Consequently, only the image 69 will be projected by the second stigmatic system on to the detecting face of the matrix 72. Whatever may be the position of the area 30 on the support 29, the image of the latter is centered on the matrix 72, in order to ensure the simultaneous reading of the nine bits of which it is composed. Because of the sequential principle of the reading, two images of separate areas 30 are never simultaneously read by the matrix 72. Obviously, in the case of the holographic recording of the data, it is not necessary to provide the optical elements 66, 67, 68, 70 and 71.

It has been seen from the foregoing that the subdivision of the reading beam into elementary beams involves the use of a set of semireflecting plates and, if necessary, lenses which are designed to prevent the increase in section of the beam propagated over a considerable distance.

Figure 8:
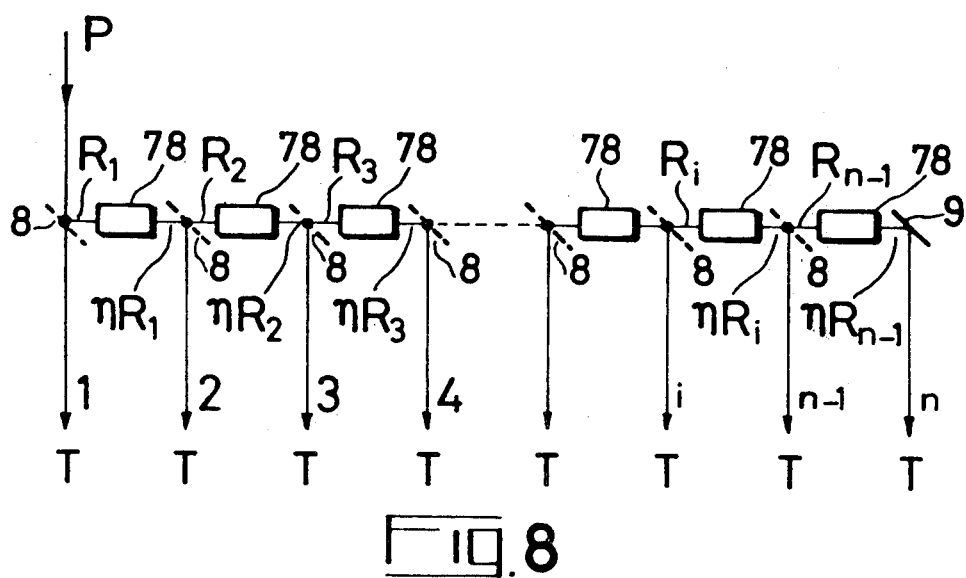
FIG. 8 is an explanatory diagram relating to the delay-action dividing optical means.

FIG. 8 shows a subdivider device with $n$ elementary beams which makes use of $n - 1$ semireflecting plates 8 and a mirror 9. Between two consecutive plates 8, the weakening of the radiation has been brought into effect by a transmission member 78, of which the transmission factor is $\eta$. The energy fractions reflected by the plates 8 are indicated by $R_1, R_2, R_3, \ldots R_i, \ldots, R_{n-1}$. So that the incident energy P is uniformly distributed, it is necessary for the portions T of energy transmitted by the plates 8 and 9 to be equal. In this case, it is necessary to verify the following conditions:

$$P = R_1 = T$$

$$\eta R_1 = R_2 + T$$

$$\eta R_2 = R_3 + T$$

$$\eta R_i = R_{i+1} = T$$

$$\eta R_{n-1} = T$$

Under these conditions:

$$R_i = T \Sigma (1/\eta)^k$$

$$k = [1, 2, \ldots (n - i)]$$

In addition, if $t_i$ is the transmission factor of the plate 8 of the row $i$, it is possible to write:

$$t_i = \frac{T}{\eta R_{i-1}}$$

or even:

$$t_i = \frac{1}{\Sigma \left(\frac{1}{\eta}\right)^k} \quad k = [0, 1, 2, \ldots, (n - i)]$$

the reflection factor of the same plate 8 being obviously equal to: $r_i = 1 - t_i$.

Assuming that the losses by reflection and transmission are 1/1000, which can be achieved with treated mirrors and lenses, it is seen that when the lenses are traversed twenty times and there are twenty reflections, the coefficient $\eta$ can have a value of about 0.96.

It has been seen from the foregoing that, when the photodetector elements are able to react in 5 nanoseconds to the signal to be read, it is possible to store up to $4.10^6$ data on a square support with a side of 20 centimeters. With about a hundred elementary reading beams, the access time to an information bit is of the order of 500 nanoseconds. The efficiency of such a store is of the order of 20 gigabits per second.

Even higher rates and shorter access times are possible with photodetector elements having a shorter response time. The optical subdivision device can be more easily produced as the access time is shorter. Accepting that it is necessary that the light radiation is propagated over a long distance in order to obtain the desired delay effects, the use of a spatially effects, the use of a spatially coherent radiation source is necessary in practice, because it is a question of obtaining a reading beam having a very small divergence. A laser is particularly suitable in this type of application, because such a source permits very considerable powers to be obtained. For example, with an argon laser, $8.10^7$ Watts/steradians/cm$^2$ are obtained continuously and 8.10 Watts/steradians/cm$^2$ in blocked procedures.

With a GaAs semiconductor laser, $10^5$ to $10^6$ Watts/steradians/cm$^2$ are obtained in pulses with a cycle of 10%.

What we claim:

1. A system for reading optical recording of binary numerical data, said recording being composed of at least one group of M (M being greater than 1) storage areas, each of said storage areas being adapted for projecting, into a detection plane, radiation corresponding to the image of P bits 0 and 1 (P being greater than 1), said system comprising:
   a spatially coherent radiation source functioning by pulses for delivering an incident reading beam;
   delay action dividing optical means ensuring the splitting up of said incident reading beam into an assembly of M collateral beams which are respectively directed towards said M storage areas, each pulse emitted by said radiation source being subdivided by said dividing optical means in order to successively illuminate said M storage areas;
   an assembly of P photoelectric detector elements located in said detection plane adapted for simultaneously detecting said P bits in said image projected by each of said storage area successively illuminated by said M collateral beams, and for furnishing P simultaneous binary electrical signals;
   and electrical memory means coupled to said detector elements for temporarily storing said binary electrical signals.

2. A reading system as claimed in claim 1, wherein each of the said storage areas is formed by an elementary hologram capable of reconstructing said image of P bits 0 and 1 at a fixed location in said detection plane from one of said collateral beams.

3. A reading system as claimed in claim 1, wherein each of said storage areas is formed by an elementary recording of nonuniform transparency capable of spatially modulating the intensity of one of the said collateral beams, said system further comprising stigmatic optical projection means intercalated between said assembly of photoelectric detector elements and said optical recording of binary numerical data, for projecting to a fixed location in said detection plane the image of any storage area illuminated by one of the said collateral beams.

4. A reading system as claimed in claim 3, wherein said stigmatic optical projection means comprise at least one optical combination composed of a matrix of M lenses respectively receiving radiations emerging from said M storage areas belonging to the said group and a convergent lens receiving the transmitted radiations emerging from said M lenses; said transmitted radiations being in the form of collimated beams and said M lenses being convergent lenses.

5. A reading system as claimed in claim 4, wherein an assembly of at least K groups of M areas are stored on said optical recording of data, said stigmatic optical projection means comprising two optical combinations in cascade form and a diffuser intercalated between said optical combinations; one of said optical combinations comprising a matrix of K lenses and a further lens picking up the transmitted radiations emerging from said K lenses; the other of said optical combinations comprising said matrix of M lenses and said convergent lens picking up said transmitted radiations emerging from said M lenses; said K lenses and said further lens being convergent lenses; said transmitted radiations emerging from said K lenses being in the form of collimated beams.

6. A reading system as claimed in claim 1, wherein when an assembly of at least K groups of M areas are stored on the said optical data recording, means for shifting the beam to K separate positions are intercalated between said radiation source and said optical recording of binary numerical data.

7. A reading system as claimed in claim 6, wherein, when several assemblies of K groups of M areas are stored on said optical data recording, means for displacement in the plane of said optical data recording are provided, in order to select one of said assemblies of K groups of M areas for reading purposes.

8. A reading system as claimed in claim 1, wherein said optical dividing means comprise a set of M − 1 semi-reflecting areas or regions which successively receive transmitted fractions of the radiated energy contained in the said reading beam and a terminal reflecting area.

9. A reading system as claimed in claim 8, wherein the time taken by the radiated energy for covering the distance separating one of said semi-reflecting regions from the following is at least equal to the duration of the pluse emission of the said radiation source.

10. A reading system as claimed in claim 8, wherein the paths followed by the reading radiation between said semi-reflecting plates are equal.

11. A reading system as claimed in claim 8, wherein the reading radiation path between two consecutive semi-reflecting plates is achieved by multiple reflections between two mirrors having parallel faces.

12. A reading system as claimed in claim 11, wherein focusing and collimating lenses are disposed between said mirrors having parallel faces and on successive linear portions of the said path in which there are multiple reflections.

13. A reading system as claimed in claim 12, wherein said focusing and collimating lenses are convergent lenses having their foci situated in the reflecting face of one of said mirrors.

* * * * *